(12) United States Patent
Kawanami et al.

(10) Patent No.: US 9,196,453 B2
(45) Date of Patent: *Nov. 24, 2015

(54) GAS FIELD IONIZATION ION SOURCE AND ION BEAM DEVICE

(71) Applicant: HITACHI HIGH-TECHNOLOGIES CORPORATION, Tokyo (JP)

(72) Inventors: Yoshimi Kawanami, Hitachinaka (JP); Tohru Ishitani, Sayama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/332,923

(22) Filed: Jul. 16, 2014

(65) Prior Publication Data

US 2014/0326897 A1 Nov. 6, 2014

Related U.S. Application Data

(63) Continuation of application No. 13/501,561, filed as application No. PCT/JP2010/067872 on Oct. 12, 2010, now Pat. No. 8,809,801.

(30) Foreign Application Priority Data

Oct. 14, 2009 (JP) .................................. 2009-237599

(51) Int. Cl.
*H01J 37/08* (2006.01)
*H01J 27/26* (2006.01)
*H01J 37/305* (2006.01)

(52) U.S. Cl.
CPC ................. *H01J 37/08* (2013.01); *H01J 27/26* (2013.01); *H01J 37/3056* (2013.01); *H01J 2237/002* (2013.01); *H01J 2237/006* (2013.01); *H01J 2237/0807* (2013.01)

(58) Field of Classification Search
CPC ..................... H01J 2237/0807; H01J 2237/006
USPC ........................................... 250/423 R, 423 F
See application file for complete search history.

(56) References Cited

U.S. PATENT DOCUMENTS 6,472,881 B1   10/2002  Sugiyama et al.
7,420,167 B2 *  9/2008  Okuda et al. ................... 250/310
(Continued)

FOREIGN PATENT DOCUMENTS

JP   58-085242    5/1983
JP   60133635     7/1985
(Continued)

OTHER PUBLICATIONS

K. Edinger, et al., "Development of a High Brightness Gas Field Ion Source", J. Vac. Sci. Technol. B 15(6), Nov./Dec. 1997. pp. 2365-2368.

(Continued)

*Primary Examiner* — Jack Berman
*Assistant Examiner* — Kevin Chung
(74) *Attorney, Agent, or Firm* — Brundidge & Stanger, P.C.

(57) ABSTRACT

Provided is a gas field ionization ion source capable of emitting heavy ions with high brightness which are suitable for processing a sample. The gas field ionization ion source according to the present invention includes a temperature controller individually controlling the temperature of the tip end of an emitter electrode (1) and the temperature of a gas injection port part (3) of a gas supply unit.

6 Claims, 9 Drawing Sheets

(56) References Cited

U.S. PATENT DOCUMENTS

| | | | |
|---|---|---|---|
| 7,525,325 B1 * | 4/2009 | Jenkins et al. | 324/754.22 |
| 2007/0138388 A1 | 6/2007 | Ward et al. | |
| 2007/0228287 A1 | 10/2007 | Ward et al. | |
| 2008/0142702 A1 | 6/2008 | Frosien et al. | |
| 2008/0217555 A1 | 9/2008 | Ward et al. | |
| 2009/0057566 A1 | 3/2009 | Winkler et al. | |
| 2009/0173888 A1 * | 7/2009 | Shichi et al. | 250/397 |
| 2009/0200484 A1 * | 8/2009 | Frosien | 250/396 R |
| 2009/0230299 A1 * | 9/2009 | Shichi et al. | 250/282 |
| 2011/0233401 A1 * | 9/2011 | Nishinaka et al. | 250/310 |

FOREIGN PATENT DOCUMENTS

| | | |
|---|---|---|
| JP | 61225748 | 10/1986 |
| JP | 63-218125 | 9/1988 |
| JP | 1-265429 | 10/1989 |
| JP | 7-192669 | 7/1995 |
| JP | 2000-251751 | 9/2000 |
| JP | 2008-140557 | 6/2008 |
| JP | 2008-270039 | 11/2008 |
| JP | 2009-517840 | 4/2009 |
| JP | 2009-517846 | 4/2009 |
| JP | 2009-163981 | 7/2009 |
| JP | 2009-187950 | 8/2009 |
| JP | 2009-218229 | 9/2009 |
| WO | 2007/067296 | 6/2007 |

OTHER PUBLICATIONS

J. Morgan, et al., "An Introduction to the Helium Ion Microscope", Reprinted from Microscopy Today, vol. 14, No. 4, Jul. 2006. pp. 24, 26, 28, 30 and 31.

H.S. Kuo, et al., "Gas Field Ion Source from an Ir/W<111> single-atom tip" Applied Physics Letters 92, 063106 (2008). pp. 063106-1-063106-3.

International Search Report and Written Opinion for PCT International Application No. PCT/JP2010/067872, mailed Nov. 22, 2010.

Japanese Office Action mailed Mar. 26, 2013 in corresponding Japanese Patent Application No. 2009-237599.

Japanese Office Action mailed Dec. 17, 2013 in Japanese Patent Application No. 2013-111230 with English language translation.

German Office Action issued Mar. 21, 2014 in corresponding German Patent Application No. 11 2010 004 053.2 with English language translation.

* cited by examiner

GAS FIELD IONIZATION ION SOURCE AND ION BEAM DEVICE

TECHNICAL FIELD

The present invention relates to a gas field ionization ion source and an ion beam device including the same.

BACKGROUND ART

Non-patent Document 1 listed below describes focused ion beam (abbreviated as FIB) devices each of which includes a gas field ionization ion source (abbreviated as GFIS) and uses gas ions of hydrogen ($H_2$), helium (He), neon (Ne), or the like. Such gas FIB devices have an advantage of not contaminating samples with Ga unlike gallium (Ga: metal) FIB devices including liquid metal ion sources (abbreviated as LMISs) which are commonly used currently. In Non-patent Document 1, GFISs can form beams finer than Ga-FIB devices because gas ions extracted from the GFISs have narrow energy width and the ion generation source is small.

Non-patent Documents 2 and 3 and Patent Document 1 listed below disclose that provision of a microprotrusion (emitter tip) to the tip end of the emitter of a GFIS or reduction of the number of atoms at the tip end of the emitter to a few atoms provides improvements in characteristics of the ion source, such as an increase in angular current density of the ion source. As an example of fabrication of such a microprotrusion, Patent Documents 2 and 3 disclose fabrication from tungsten (W) of the emitter material by field evaporation. Non-patent Document 3 listed below discloses fabrication of the microprotrusion using a second metal different from the emitter material of a first metal.

Non-patent Document 2 and Patent Documents 2 and 3 listed below disclose scanning charged particle microscopes including GFISs configured to emit ions of He as a light element. From the viewpoint of weight of irradiation particles, a He ion is about 7,000 times as heavy as an electron but is light having a weight of about $1/17$ of a Ga ion. Accordingly, sample damage depending on the magnitude of momentum transferred to atoms of the sample from the irradiating He ions is a little larger than that of electrons but is very smaller than that of Ga ions. Moreover, the region where secondary electrons are excited by penetration of the irradiating particles into the sample surface is more localized in the sample surface than that in the case of electron irradiation. Accordingly, it is expected that images by the scanning ion microscope (abbreviated as SIM) are more sensitive to information of the sample surface than images by scanning electron microscopes (abbreviated as SEM). Furthermore, from the viewpoint of microscopes, the effect of diffraction in convergence of an ion beam can be ignored since ions are heavier than electrons. Accordingly, the SIMs are characterized by providing an image with a very large depth of focus.

Non-patent Document 3 listed below states that an ion current can be increased by decreasing the temperature of the emitter tip in the GFIS. Non-patent Document 3 also states that even if the temperature is decreased lower than around the devaporization point (boiling point) of the gas, the ion current is not increased, but on the contrary reduced in some cases.

Patent Document 3 listed below states that the GFIS uses a gas mixture. The component ratio of the added gas is very low, and the purpose of the added gas is not clear. According to the description of the specification thereof, it can be thought that the added gas is expected to contribute to formation or reproduction of the tip end of the emitter tip or contribute to stabilization of the ion source. Moreover, the same document states that the GFIS includes plural independent gas supply means.

Patent Document 4 listed below states that first and second gasses are taken into an emitter region for generation of ion beams of the first and second gasses.

Patent Document 5 listed below describes an ion source including two or more gas introduction lines in order to switch between a gas ion beam type for processing of a sample and a gas ion beam type for observation of the sample.

PRIOR ART DOCUMENTS

Patent Documents

Patent Document 1: Japanese Patent Laid-open Publication No. 58-854242
Patent Document 2: Japanese Patent Laid-open Publication No. 7-192669
Patent Document 3: Japanese Translation of PCT international Application Publication No. 2009-517846
Patent Document 4: Japanese Patent Laid-open Publication No. 2009-187950
Patent Document 5: Japanese Patent Laid-open Publication No. 2008-270039

Non-Patent Document

Non-patent Document 1: K. Edinger, V. Yun, J. Melngailis, J. Orloff, and G Magera, J. Vac. Sci. Technol. B 15 (No. 6) (1997) 2365
Non-patent Document 2: J. Morgan, J. Notte, R. Hill, and B. Ward, Microscopy Today, July 14(2006) 24
Non-patent Document 3: H. -S. Kuo, I. -S. Hwang, T. -Y. Fu, Y. -H. Lu, C. -Y. Lin, and T. T. Tsong, Appl. Phys. Letters 92(2008) 063106

SUMMARY OF THE INVENTION

In the case of using a GFIS for processing a sample as in the case with Ga-FIBs, it is possible to use a gas generating heavy ionic species with a high sputtering rate such as argon (Ar), for example. However, since such a heavy gas generally has a high devaporization point (boiling point), the temperature of the gas needs to be increased sufficiently, which leads to an increase in the temperature of the emitter tip. This makes it difficult to obtain enough ion current, so that it is difficult to provide an ion beam with high brightness.

The present invention was made to solve the aforementioned problems, and an object of the present invention is to provide a GFIS capable of emitting heavy ions with high brightness which are suitable for processing a sample.

A gas field ionization ion source according to the present invention includes a temperature controller individually controlling a temperature of the tip end of an emitter electrode and a temperature of a gas injection port of a gas supply unit.

According to the gas field ionization ion source of the present invention, the temperature of the tip of the emitter electrode can be decreased with the gas kept at high temperature. Accordingly, the temperature of the tip end of the emitter electrode can be decreased in order to obtain an ion beam with high brightness while the temperature of the gas is increased in order to emit heavy ions.

MODES FOR CARRYING OUT THE INVENTION

<Embodiment 1>

Figure 1:
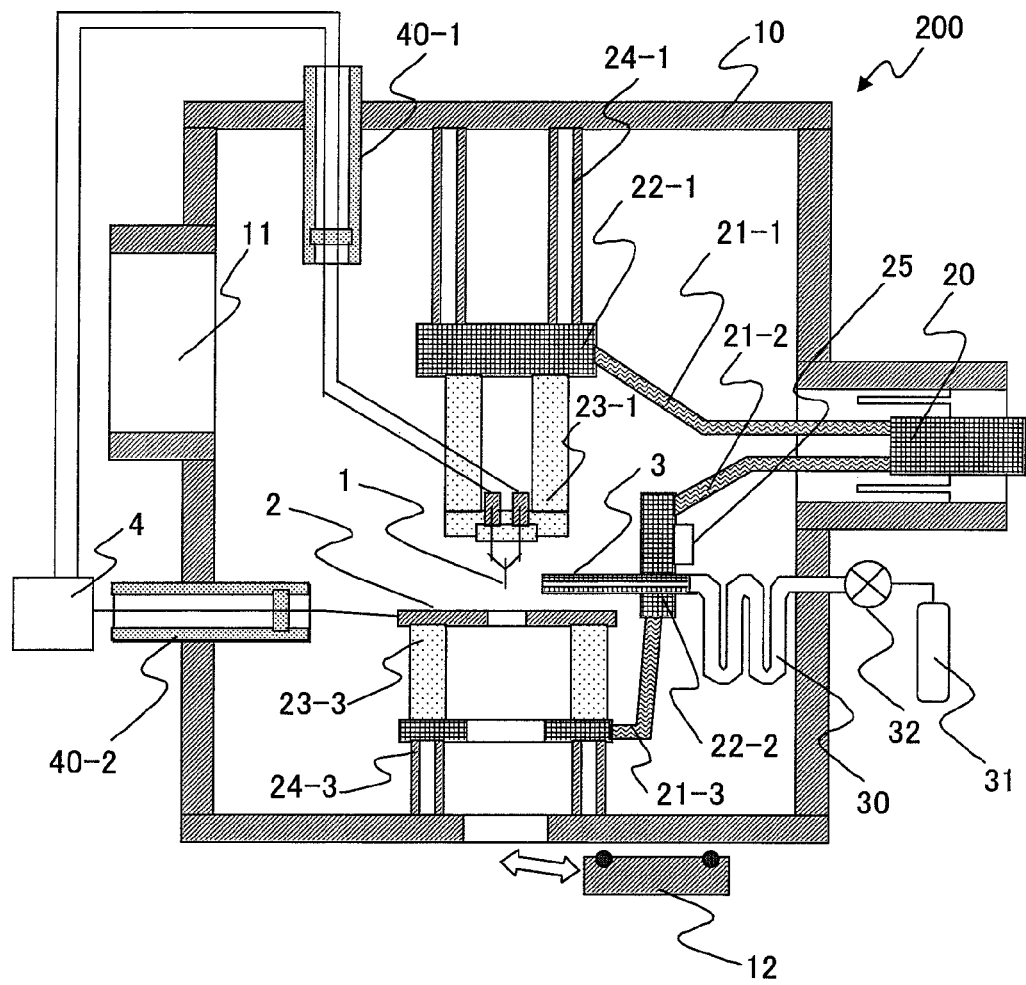
FIG. 1 is a cross-sectional view showing a configuration of an ion beam device 200 according to Embodiment 1.

FIG. 1 is a cross-sectional view showing a configuration of an ion beam device 200 according to Embodiment 1. The ion beam device 200 includes a gas field ionization ion source (GFIS) and converging an ion beam emitted from the GFIS to irradiate a sample with the ion beam for observation or processing of the sample. Hereinafter, a description is given of constituent components shown in FIG. 1.

A vacuum vessel 10 is kept at ultrahigh vacuum of the $10^{-8}$ Pa range by an vacuum pumping system (not shown) connected to an exhaust port 11. If the ion beam device 200 is not connected to another device, the vacuum vessel 10 is closed by a valve 12.

In the vacuum vessel 10, an emitter tip 1 having a needle-like point and an extraction electrode 2 having an opening facing the tip end of the emitter tip 1 are placed. The emitter tip 1 requires an axis alignment mechanism but is not shown in the drawings to simplify the description.

A gas injection port part 3 of a gas supply pipe 30 supplies gas to be ionized to near the tip end of the emitter tip 1. The gas supply pipe 30 is connected to a gas cylinder 31 through a valve 32.

The emitter tip 1 and the extraction electrode 2 are connected to an extraction voltage application unit 4 through high voltage introduction terminals 40-1 and 40-2, respectively. Ionization needs only one line for the purpose of applying an electrical potential to the emitter tip 1. In Embodiment 1, two lines are connected to the emitter tip 1 for the purpose of heating a filament unit at the base of the emitter tip 1.

The emitter tip 1 is cooled by heat exchange with a cooing head 20 introduced from the outside of the vacuum vessel 10 (the cooling head 20 is connected to a Gifford-McMahon freezer, for example) through a heat transfer braided cable (oxygen-free copper) 21-1, a heat transfer supporter (oxygen-free copper) 22-1, and a heat transfer insulator (sapphire) 23-1. The gas injection port part 3 is cooled by heat exchange with the cooling head 20 through a heat transfer braided cable (oxygen-free copper) 21-2 and a heat transfer supporter (oxygen-free copper) 22-2. The gas injection port part 3 is made of oxygen-free copper having good heat conductivity. Since such materials have good heat conductivities, the emitter tip 1 and gas injection port part 3 are cooled to substantially a same temperature.

The heater 25 heats the gas injection port part 3. The temperature of the gas injection port part 3 can be therefore set higher than the emitter tip 1. Even in the case of using gas with a high devapolization point, therefore, the temperature of the gas can be kept at the devapolization point or higher.

The aforementioned materials of oxygen-free copper are plated with gold in order to reduce heat radiation. Heat insulation supporters (stainless steel thin-wall pipes) 24-1 and 24-3 contribute to blocking entry of heat from the outside. Moreover, the gas supply pipe 30 is made of stainless steel having poor heat conductivity other than the gas injection port part 3 and is wound to be extended to a long conduction distance, thus preventing heat from entering from the outside. Moreover, in order to keep the temperature of each unit stable, several heat shield walls are required but are not shown in the drawings for simplification.

Figure 2:
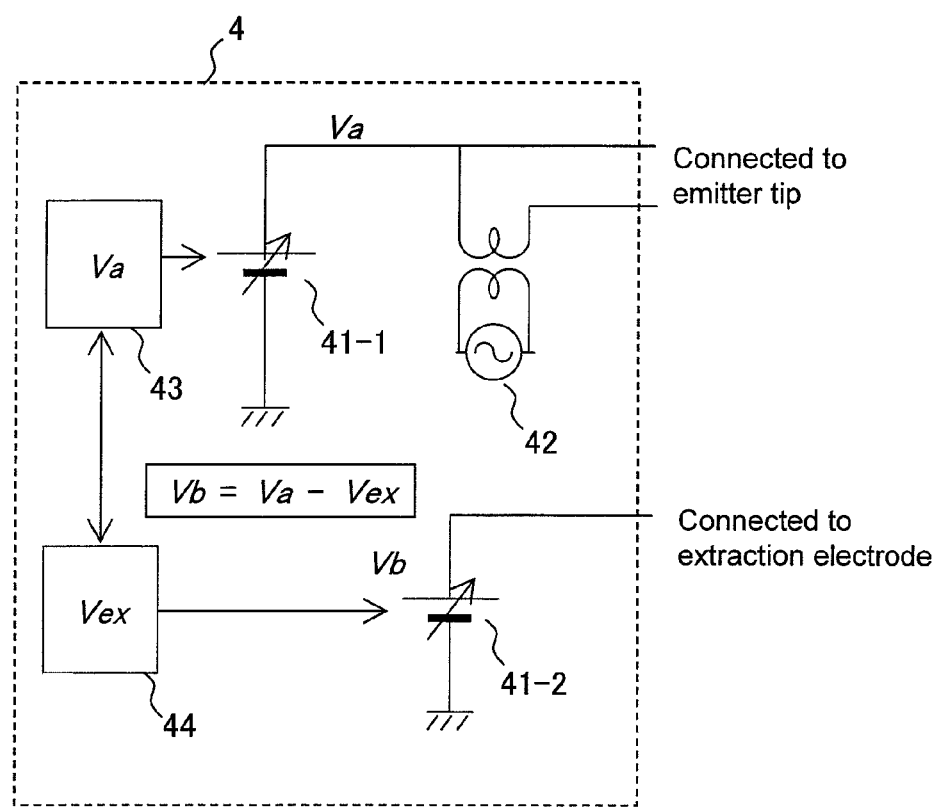
FIG. 2 is a view illustrating an internal configuration of an extraction voltage application unit 4.

FIG. 2 is a view showing an internal configuration of the extraction voltage application unit 4. An acceleration voltage controller 43 and an extraction voltage controller 44 respectively control high voltage power supplies 41-1 and 41-2 while adjusting the subordinate-superior relation between acceleration voltage Va and extraction voltage Vex so that the applied voltage does not become negative.

An emitter tip heating power supply 42 is configured to heat the emitter tip 1 to about 1000 K to improve the condition of the point thereof and is not used for emitting ions.

A "temperature controller" in Embodiment 1 includes the mechanisms for adjusting the temperatures of the emitter tip 1 and gas supply port 3 such as the cooling head 20, heat transfer braided cables, heat transfer supporters, heat transfer insulators, and heater 25. The emitter tip heating power supply 42 is not included in the temperature controller in Embodiment 1.

A "gas field ionization ion source" according to Embodiment 1 includes the emitter tip 1, extraction electrode 2, gas supply pipe 30, gas injection port part 3, extraction voltage application unit 4, and the aforementioned temperature controller.

Hereinabove, the description is given of the configuration of the ion beam device 200 according to Embodiment 1. Next, a description is given of the operation of the ion beam device 200 according to Embodiment 1.

As the extraction voltage application unit 4 applies a voltage with the emitter tip set positive and the extraction electrode negative, some of gas atoms (molecules in some cases) going out from the gas injection port part 3 and reaching the tip end of the emitter tip 1 become positive ions due to field ionization, thus causing ion emission at a certain tip end of time.

In conventional ion beam devices, for the purpose of increasing gas pressure around the tip end of the emitter tip 1, a substantially closed chamber is provided ahead of the gas injection port part 3, or the gas injection port part 3 and emitter tip 1 are cooled with a same refrigerant. Such configurations result in that the gas injection port part 3 and emitter tip 1 are set to substantially a same temperature.

Accordingly, if the emitter tip 1 is cooled to increase emitted ions, gas is also cooled. As the temperature of the gas approaches the devapolization point (boiling point), the gas is gradually liquefied, and supply of the gas can be inhibited. This can be thought to prevent an enough increase in ions emitted by field ionization from heavy gas having a high devaporization point.

In Embodiment 1, therefore, a cooling system is configured so that the gas injection port part 3 always has a temperature higher than temperature of the emitter tip 1. By the operations of the cooling head 20, heat transfer braided cables 21-1 and 21-2, heat transfer supporters 22-1 and 22-2, and heat transfer insulator 23-1, the emitter tip 1 and gas injection port part 3 are cooled to increase the emitter current and allow emission of an ion beam with high brightness. Moreover, in order to address the high devaporization point of heavy ions, the gas injection port part 3 is heated with a heater 25 as needed. With such configurations, the temperatures of the emitter tip 1 and the gas injection port part 3 can be individually adjusted.

Hereinabove, the description is given of the operation of the ion beam device 200 according to Embodiment 1. The followings complement the other points.

In Embodiment 1, the emitter tip 1 is a hairpin-shaped filament to the tip end of which a single crystal of tungsten (W) is welded. On the (111) crystal plane of W at the tip end of the emitter tip 1, an atom pyramid of iridium (Ir) is formed. The gas is Argon (Ar). The mass of an Ar ion is a little larger than half the mass of a Ga ion, and Ar ions are therefore suitable for processing.

The ion extraction voltage is about 4 kV. The gas injection port part 3 is located several millimeters away from the emitter tip 1 to prevent excessive discharge. When the temperature of the emitter tip 1 is decreased to about 40 K with the gas injection port part 3 being kept at a temperature of about 90 K (the boiling point of Ar is about 87 K), the ion current monotonically increases.

As a result, the ion current of Ar, which had been said to have a peak at around 70 K, can be increased several times or more.

The ion beam device 200 can use xenon (Xe) gas, for example, which is heavier than Ar. In such a case, the temperature of the gas injection port part 3 needs to be increased to about 170 K.

In Embodiment 1, only one GM freezer is used, but two independent freezers may be used. Use of two independent freezers increases the cost but facilitates temperature control. A second GM freezer may be provided instead of the heater 25 or together with the heater 25 to adjust the temperature of the gas injection port part 3, for example.

In Embodiment 1, the extraction voltage application unit 4 has a configuration shown in FIG. 2 but may employ another configuration if appropriate voltage difference can be generated between the emitter tip 1 and extraction electrode 2.

Figure 3:
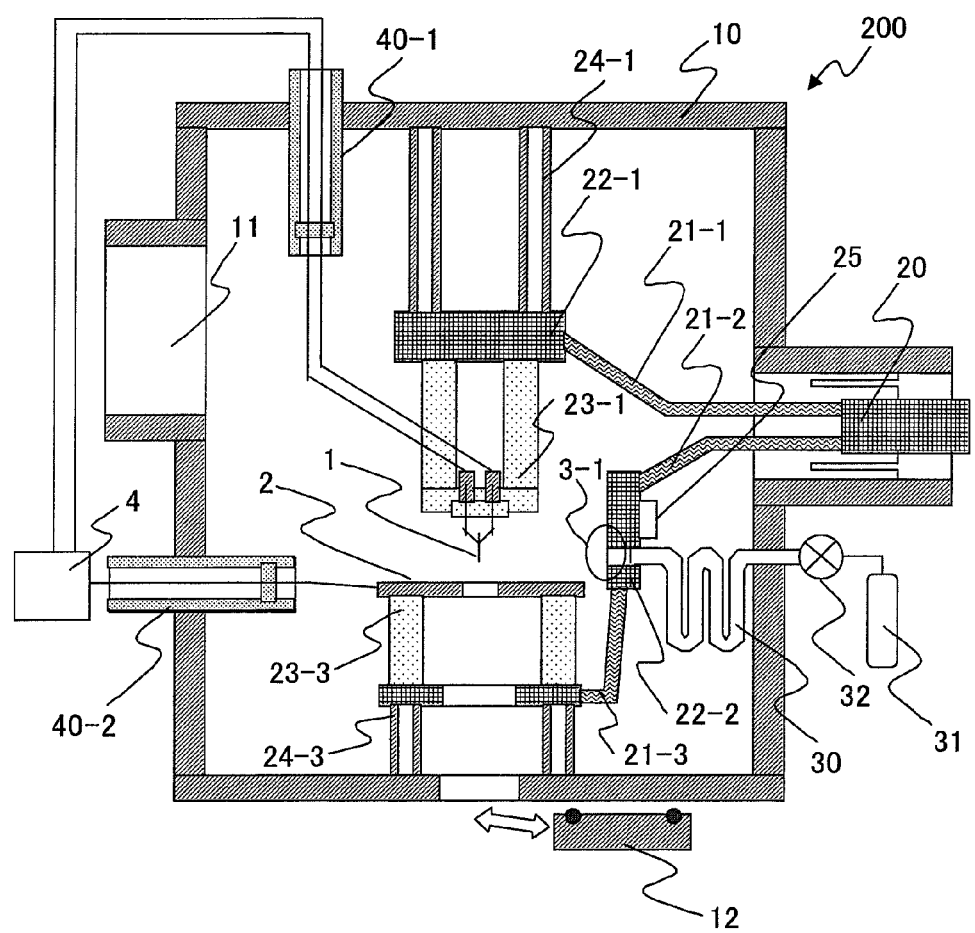
FIG. 3 is a cross-sectional view showing a configuration with a gas injection port part 3 of a gas supply pipe 30 modified.

FIG. 3 is a cross-sectional view showing a configuration with the gas injection port part 3 of the gas supply pipe 30 modified. In FIG. 1, the gas injection port part 3 of the gas supply pipe 30 is protruded in a nozzle-like shape. However, in the configuration shown in FIG. 3, the injection port part 3 does not include the nozzle-like protrusion. In such a case, part around the opening (gas outlet) of the heat transfer supporter 22-2 is treated as a gas injection port part 3-1 of the gas supply pipe 30.

In this embodiment, as shown in FIGS. 1 and 3, it is desirable that the openings of the gas injection port parts 3 and 3-1 of the gas supply pipe 30 are directed to the tip end of the emitter tip 1. This is for the purpose of increasing the possibility that supplied gas directly reaches the tip end of the emitter tip 1. Moreover, if the gas reaches the supporting member at the base of the emitter tip 1 instead of the point thereof, the gas kept at the devaporization point (boiling point) or more is cooled and adsorbed. The gas therefore hardly reaches the tip end of the emitter tip 1.

However, since the gas is emitted and spread from the openings of the gas injection port parts 3 and 3-1, the direction of each opening has a certain allowance, and the openings do not need to be directed exactly to the tip end of the emitter tip 1. Moreover, part of the gas not ionized, most of which is exhausted, is likely to be adsorbed onto the supporting member of the emitter tip 1 having a low temperature. It is therefore desirable that the gas adsorbed onto the supporting member thereof is released by increasing the temperatures of the emitter tip 1 and supporting member to the devaporization point (boiling point) of the used gas or higher. An emitter tip heating power supply 42 can be used for such heating.

As described above, according to Embodiment 1, the emitter tip 1 can be cooled to increase the emitter current while the gas injection port part 3 is heated by the heater 25 to be kept at the devaporization point or higher. Accordingly, even in the case of using gas of heavy ions such as Ar or Xe, it is possible to provide an ion beam having high brightness with the gas kept at the devaporization point or higher.

<Embodiment 2>

Figure 4:
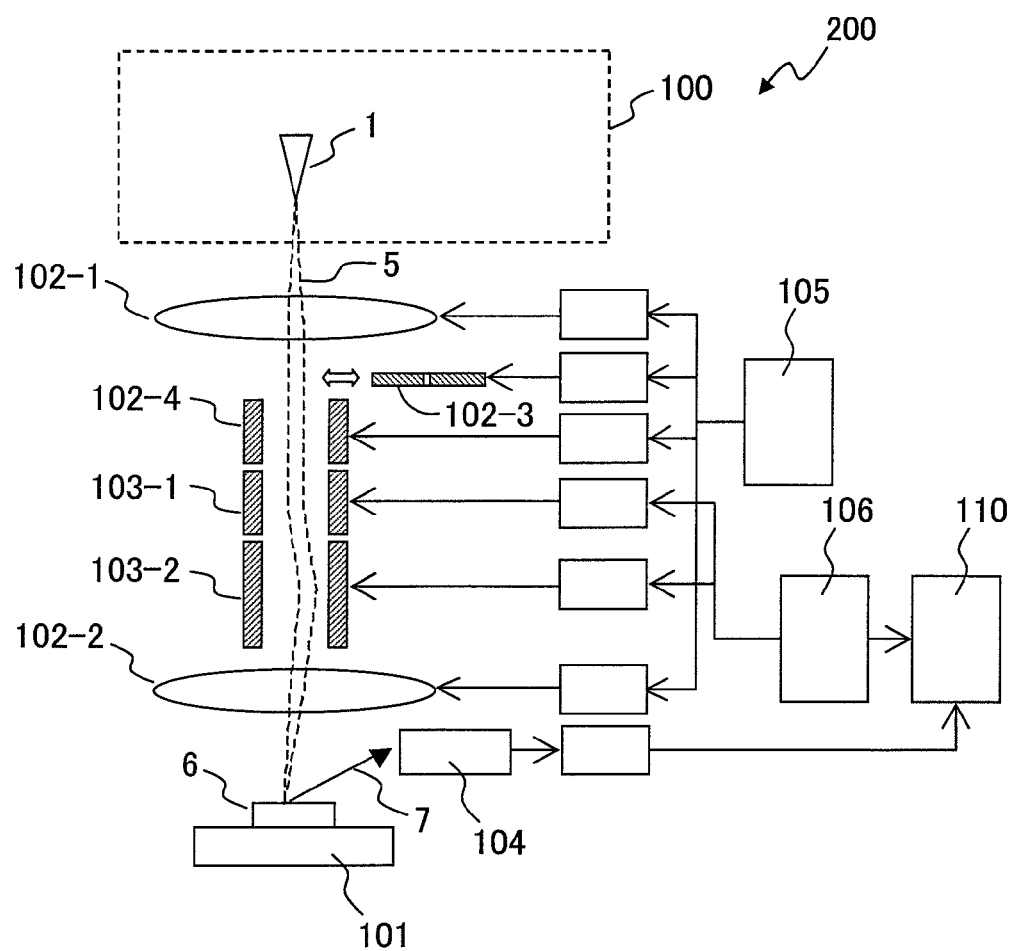
FIG. 4 is a schematic view showing a configuration of an ion beam device 200 according to Embodiment 2.

FIG. 4 is a schematic view showing a configuration of an ion beam device 200 according to Embodiment 2 of the present invention. The ion beam device 200 according to Embodiment 2 is a device in which the GFIS described in Embodiment 1 (indicated by reference numeral 100 in FIG. 4) is incorporated in a focused ion beam device manufactured for a conventional Ga-LMIS. A description is given of each configuration of FIG. 4 below.

An ion beam 5 emitted from the emitter tip 1 is converged by electrostatic lenses 102-1 and 102-2 to irradiate the sample 6. The irradiation position of the ion beam 5 on the sample 6 is adjusted by deflecting the ion beam 5 with deflectors 103-1 and 103-2.

Secondary electrons 7 generated from the sample 6 are detected by a secondary electron detector 104, and a secondary electron observation image in which signal intensity corresponds to the deflection intensity is formed by a display 110. The user can specify the position at which the ion beam 5 irradiates the sample on the screen while seeing the secondary electron observation image using the display 110.

A lens system 102 including the electrostatic lenses 102-1 and 102-2, a beam limiting diaphragm 102-3, and an aligner 102-4 is controlled by a lens system controller 105. A deflection system 103 including the deflectors 103-1 and 103-2 is controlled by a deflection system controller 106. Reference numerals of boxes indicating drivers for the units thereof are omitted.

An "image processing unit" in Embodiment 2 corresponds to the display 110. A "controller" corresponds to the lens system controller 105 and deflection system controller 106.

As described above, according to Embodiment 2, it is possible to obtain a focused ion beam device using a beam of heavy ions such as Ar or Xe for processing of a sample.

<Embodiment 3>

Embodiment 1 and 2 describe that a heavy ionic species is emitted with high brightness. On the other hand, before processing, observation of an SIM image and the like is carried out in order to determine the beam irradiation position. In this process, it is necessary to project the ion beam onto the sample. At this time, the ion beam can give extra processing damage to the sample. However, reducing the ion current or dose amount of ions for the purpose of reducing the processing damage includes a problem.

First, the angle at which ions are emitted from the GFIS is about one digit smaller than that in the case of the Ga-LMIS. Accordingly, even if the angle is limited, the ion current can be reduced only slightly. Moreover, if the SIM image is obtained with the dose amount of ions reduced, the positional accuracy is reduced due to noise.

In Embodiment 3 of the present invention, in order to solve the aforementioned problems, a description is given of a configuration and an operation which allow use of beams of different ionic species between SIM image observation and processing by switching between different ionic species at high speed.

Figure 5:
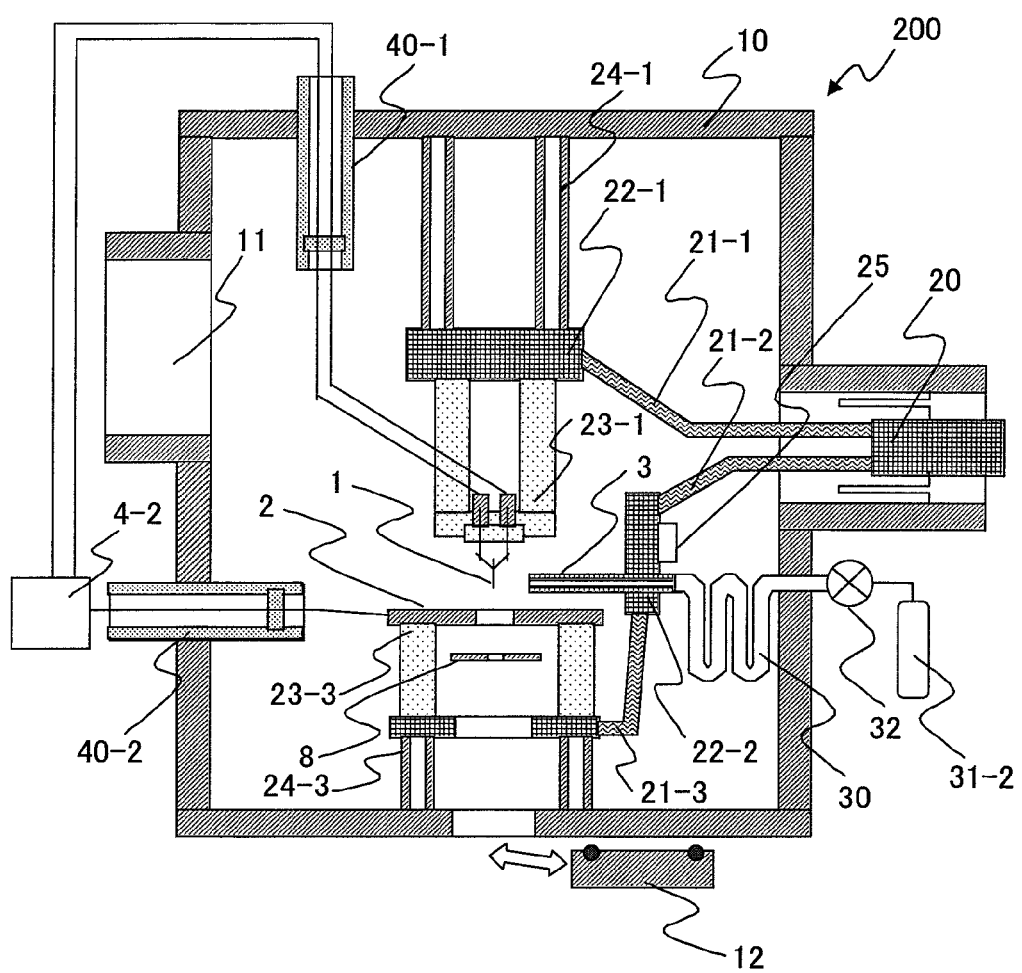
FIG. 5 is a cross-sectional view showing a configuration of an ion beam device 200 according to Embodiment 3.

FIG. 5 is a cross-sectional view showing a configuration of the ion beam device 200 according to Embodiment 3. The ion beam device 200 according to Embodiment 3 includes a substantially same configuration as that described in any of Embodiments 1 and 2 but is different from Embodiments 1 and 2 in a configuration to switch between ionic species.

A gas cylinder 31-2 is filled with a gas mixture including plural major components.

An extraction limiting diaphragm 8 includes an aperture allowing passage of an ion beam emitted by the emitter electrode. By setting proper position and size of the aperture, the extraction limiting diaphragm 8 selectively allows passage of a beam of a desired ionic species. The details thereof are described with FIG. 6 later described.

An extraction voltage application unit 4-2 includes a memory configured to store values of the extraction voltage according to the number of major components of the gas mixture. These values are used to change the extraction voltage in response to the switch of the ionic species. The details thereof are described with FIG. 6 later described. The aforementioned memory included by the extraction voltage application unit 4-2 corresponds to a first storage in Embodiment 3.

Hereinabove, the configuration of the ion beam device 200 according to Embodiment 3 is described. Next, a description is given of the operation of the ion beam device 200 according to Embodiment 3 in the case of using a gas mixture containing 40% He and 60% Xe.

Figure 6A:
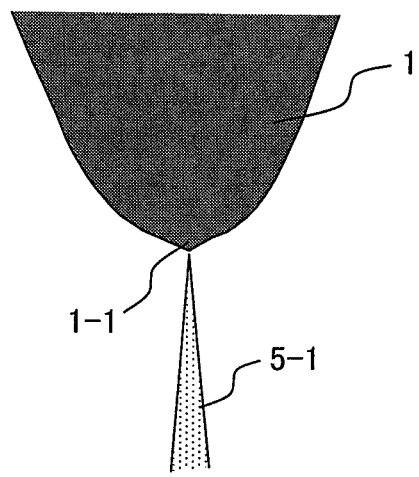
FIGS. 6A and 6B are views showing a change of an ion beam in the case of increasing the extraction voltage.
Figure 6B:
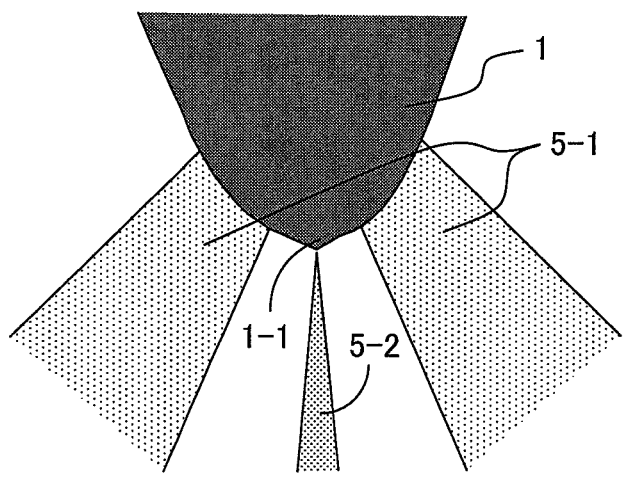

FIGS. 6A and 6B are views showing a change of the ion beam with an increase in extraction voltage. FIGS. 6A and 6B show an ion beam when the extraction voltage is high and when the extraction voltage is low, respectively.

Xe is more easily field ionized than He. Accordingly, as the extraction voltage is increased, first, an ion beam 5-1 composed of only Xe ions as shown in FIG. 6A is emitted from the emitter tip 1, especially, from a microprotrusion 1-1 at the tip end of the same.

As the extraction voltage is further increased, Xe starts to be emitted from a large area to reduce the brightness of the ion source, and then the ions are not emitted from the microprotrusion 1-1. The brightness of the ion source is further reduced.

As the extraction voltage is still further increased, He is also ionized in addition to Xe. In this state, as shown in FIG. 6B, an ion beam 5-1 composed of only He ions is emitted from the microprotrusion 1-1 at the tip end of the emitter tip 1. The ion beam 5-1 composed of only Xe ions is emitted with a large angle from the periphery of the ion beam 5-2.

In the state of FIG. 6B, the spread angle of the ion beam 5-2 emitted from the microprotrusion 1-1 is not more than several degrees. Accordingly, the extraction limiting diaphragm 8 having an appropriate aperture selectively allows passage of the ion beam 5-2 composed of only He ions out of He and Xe ions. In the example of FIG. 6, provision of the extraction limiting diaphragm 8 including an aperture not larger than the spread angle of several degrees just under the emitter tip 1 allows passage of the Xe ion beam when the extraction voltage is low and allows passage of the He ion beam when the extraction voltage is high.

As described above, the correspondence between values of the extraction voltage in the states of FIGS. 6A and 6B and the ionic species used in the same is previously stored in a storage device such as a memory. Accordingly, the ionic species (He and Xe ions herein) can be instantly switched from each other by calling the stored values of the extraction voltage and changing the extraction voltage.

Figure 7:
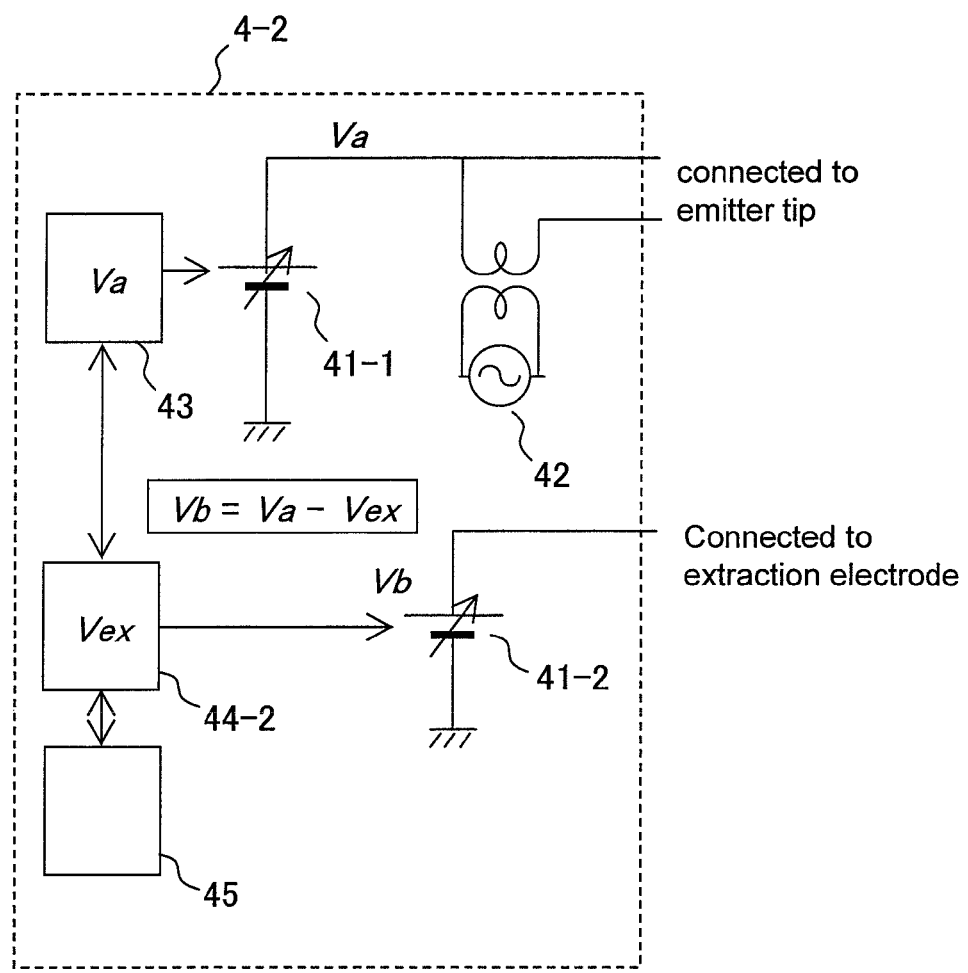
FIG. 7 is a view showing an internal configuration of an extraction voltage applying unit 4-2 of Embodiment 3.

FIG. 7 is a view showing an internal configuration of the extraction voltage application unit 4-2 in Embodiment 3. The configuration of the extraction voltage application unit 4-2 is substantially the same as that described in Embodiment 1 using FIG. 2 but differs in that an extraction voltage controller 44-2 stores values of the extraction voltage corresponding to the gas components in an extraction voltage memory 45 and can calls the same to change the extraction voltage.

Switch of the ionic species in the GFIS can be implemented by a method of switching between plural gas cylinders 31 through a valve, for example, instead of the method explained in Embodiment 3. However, it takes several hours for gas to reach the stable state, and changing the gas is not real. Embodiment 3 is advantageous in that the ionic species can be switched from each other within a time required to change the extraction voltage (about several ms).

The method using the extraction limiting diaphragm 8 to selectively allowing the passage of a desired one of beams of plural kinds of components contained in the gas mixture can be used alone or can be used in combination with the method explained in Embodiment 1 and 2.

In the case of a combination of Embodiment 3 and the method explained in Embodiment 1 for using gas of heavy ions, the gas to be mixed in Embodiment 2 can be gas of various types of heavy ions. In this case, the temperature of the gas injection port part 3 needs to be determined according to the gas component having the highest boiling point in the gas mixture to be used. In the example shown in Embodiment 3, He has a boiling point higher than Xe, and the temperature of the gas injection port part 3 should be set to, for example, about 170 K.

The gas mixture in Embodiment 3 includes two major components, but a gas mixture including three or more major components can be used in the same way as that of Embodiment 3. Moreover, even in the case of using only ionic species corresponding to two components in a gas mixture which includes three or more major components and storing only two values of the extraction voltage, the same effects as Embodiment 3 can be exerted.

<Embodiment 4>

Figure 8:
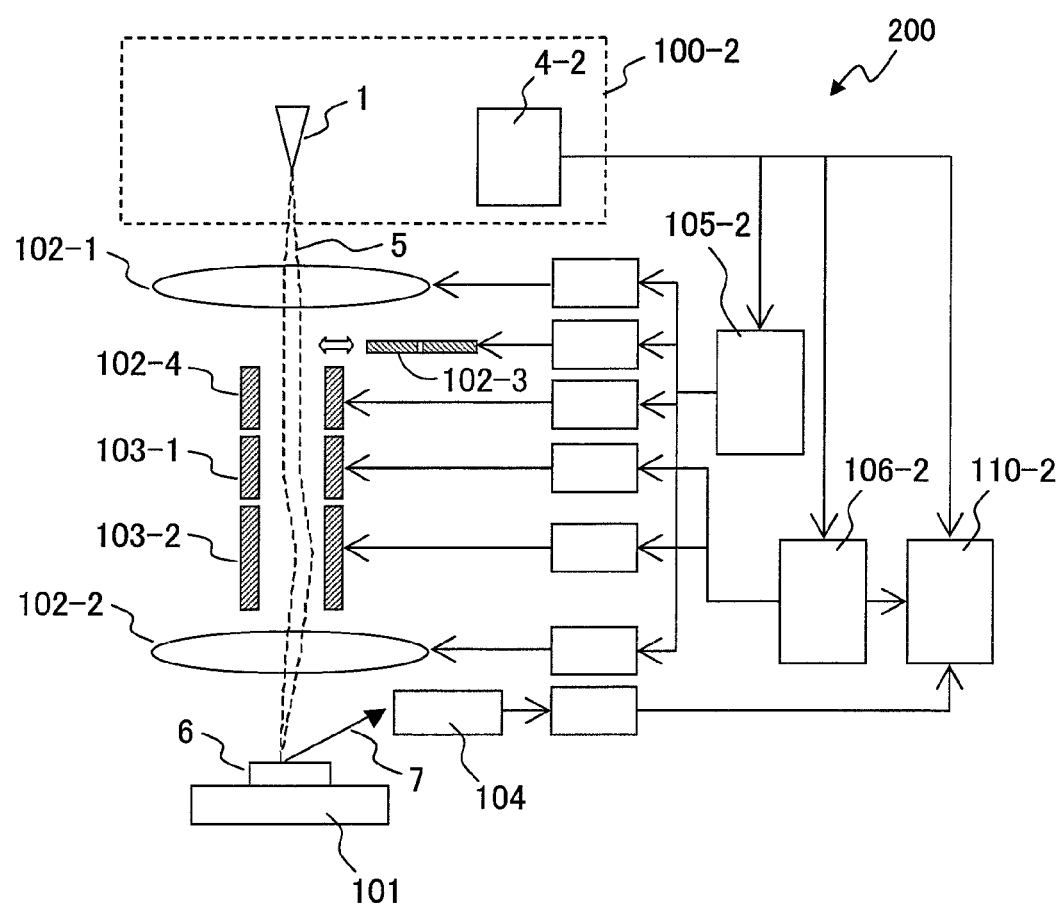
FIG. 8 is a schematic view showing a configuration of an ion beam device 200 according to Embodiment 4.

FIG. 8 is a schematic view showing a configuration of an ion beam device 200 according to Embodiment 4 of the present invention. The ion beam device 200 according to Embodiment 4 has a configuration in which the GFIS (indicated by reference numeral 100-2 of FIG. 8) explained in Embodiment 3 is incorporated in a focused ion beam device manufactured for the conventional Ga-LMIS and is improved. Next, a description is given of the configuration of FIG. 8.

Provision of the GFIS 100-2 allows quick switch of the ionic species included in the gas mixture. To change the value of the extraction voltage to be read, the ion extraction voltage application unit 4-2 outputs a signal indicating a change of the extraction voltage to a lens system control 105-2 and a deflection system controller 106-2.

If the extraction voltage varies on the ionic species, the settings of the lens and deflection systems need to be changed. The lens system controller 105-2 and deflection system controller 106-2 individually include storage devices such as memories storing the settings for each ionic species. Upon receiving the signal indicating the switch of the ionic species from the ion extraction voltage application unit 4-2, the lens system controller 105-2 and deflection system controller 106-2 call a corresponding setting and perform a control corresponding to the ionic species. The memories included in the lens system controller 105-2 and deflection system controller 106-2 correspond to a "second storage unit" in Embodiment 4.

The display 110-2 stores a secondary electron observation image in a storage device such as a memory. At this time, the display 110-2 stores the signal from the ion extraction voltage application unit 4-2 indicating the switch of the ionic species together as a label. The correspondence between the ionic species and the secondary electron observation images can be thus stored.

The advantages obtained by the aforementioned configuration are described for the case of using a gas mixture of He and Xe.

The ion beam device 200 irradiates the sample 6 with the ion beam 5 of He ions to obtain a secondary electron observation image and then stores the same in the storage device included in a display 110-2. Thereafter, the user visually confirms the secondary electron observation image on the display 110-2 and specifies the position of a part to be processed on the secondary electron observation image. The ion beam 5 is changed to a Xe ion beam and is projected to the specified position for processing. In other words, to determine the irradiation position of the ion beam, the ion beam device 200 irradiates the sample 6 with a He ion beam, and at processing, the ion beam device 200 irradiates the sample 6 with a beam of heavier Xe ions. In such manner, the ionic species can be changed according to the purpose.

He ions hardly cause sputtering and therefore can provide a secondary electron observation image with a high SN ratio and a high resolution. The user determines the irradiation position while seeing the thus-obtained electron observation image and projects the Xe ion beam at the determined position for processing. Accordingly, the ion beam device 200 has an effect capable of processing the sample 6 with high accuracy without damaging the same.

<Embodiment 5>

Embodiment 4 describes the configuration of the ion beam device 200 capable of using different ionic species for determination of the irradiation position and for processing. In Embodiment 5 of the present invention, a description is given of an example in which the function of switching between the ionic species is used for another purpose.

In Embodiment 5, the gas supplied to the GFIS is a gas mixture containing 30% $H_2$ and 70% He. In this case, two types of secondary electron observation images by H and He are obtained for the same sample 6. Since both of these ionic species hardly cause sputtering, it is possible to obtain surface images with high SN ratios and high resolutions.

These two secondary electron observation images include components having a same sensitivity to the surface roughness and components having different sensitivities to the surface element species. The display 110-2 performs comparison calculation for these two secondary electron observation images, thus generating an image specific to the surface roughness or an image specific to the surface element species, for example.

On the other hand, if the secondary electron observation image is obtained using a single ionic species, the secondary electron yield (detection value/ion current) depending on variations in mass numbers of elements/materials has a dependency on the element periodic low. Accordingly, the secondary electron yields for elements of different mass numbers have very similar values in some cases. In such a case, it is difficult to discriminate the elements from each other in the secondary electron observation image.

In contrast, if the ionic species is changed, the dependency of the secondary electron yield depending on variations in mass numbers of elements/materials on the element periodic low is changed. Accordingly, use of a combination of the secondary electron yields for different ionic species allows explicit determination of the difference between the elements/materials. In this case, it is better to previously prepare a table of second electron yields of both ionic species for each element/material. This can provide an effect facilitating identification of elements/materials which are difficult to determine because having similar detection values in the second electron observation image obtained with a single ionic species. For example, the identification can be accurately carried out by providing a secondary electron yield reference of a known material on a sample stage 101 and previously correcting current of the ion beam 5 for both ionic species.

To obtain a more accurate observation image by comparing the processing results using plural ionic species as described above is impossible by only a secondary electron observation image obtained by a single ionic species.

In the above description, the secondary electron observation images are compared. As for images obtained by detecting secondary particles other than secondary electrons, such as secondary ions or X rays, similar to the secondary electron observation images, comparison calculation of secondary particle images obtained using different ionic species possibly provides new information on a sample.

<Embodiment 6>

Embodiments 3 to 5 show that ionic species can be changed quickly by calling extraction voltages previously stored corresponding to the major components of a gas mixture from the storage device and calling the corresponding settings of the lens and deflection systems.

It can be said that changing the extraction voltage according to the ionic species is equivalent to changing the electrical field intensity at the tip end of the emitter tip 1 according to the ionic species. Accordingly, Embodiment 6 of the present invention describes a configuration capable of exerting an effect equivalent to changing the extraction voltage by changing the electric field intensity at the tip end of the emitter tip 1 through a method different from Embodiments 3 to 5. Embodiment 6 also describes an operational example of such a configuration.

FIG. 9 illustrates views showing a configuration example of a GFIS exerting an effect equivalent to that of Embodiments 3 to 5. For simplifying the drawings, FIG. 9 shows only an arrangement of the electrodes and power supply.

Figure 9A:
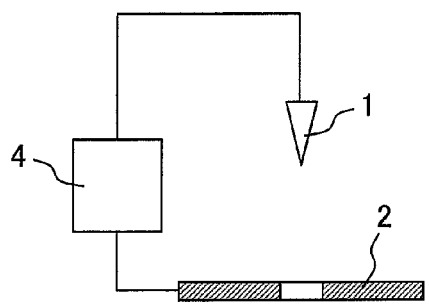
FIGS. 9A to 9D are views showing configuration examples of GFISs exerting equivalent effects to Embodiments 1 to 5.
Figure 9B:
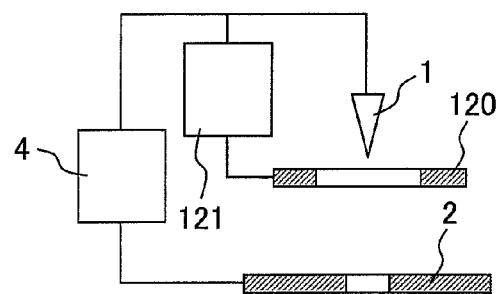

FIG. 9A shows the same arrangement of the electrodes and power supply as that of Embodiment 1. FIG. 9B shows another configuration example exerting an effect equivalent thereto.

In FIG. 9B, a suppression electrode 120 is provided between the emitter tip 1 and extraction electrode 2. Between the emitter tip 1 and suppression electrode 120, a suppression voltage application unit 121 is connected. The suppression voltage application unit 121 applies a suppression voltage smaller than the extraction voltage to the suppression electrode 120 to change the electrical field intensity at the tip end of the emitter tip 1.

Figure 9C:
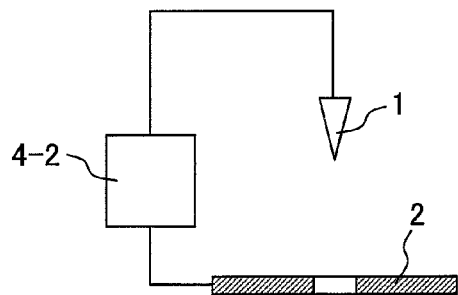
Figure 9D:
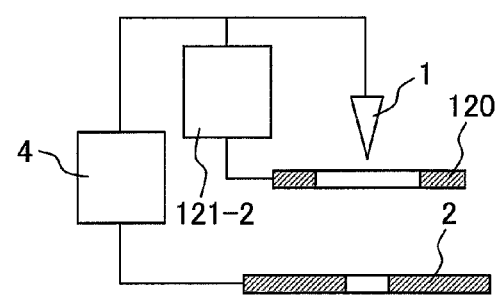

FIG. 9C shows the same arrangement of the electrodes and power supply as those of Embodiments 3 to 5. FIG. 9D shows another configuration example exerting an effect equivalent thereto.

Changing the extraction voltage and ionic species in FIG. 9C is equivalent to changing the suppression voltage and ionic species in FIG. 9D in which the suppression electrode 120 is provided.

The suppression voltage application unit 121-2 includes a storage device storing a suppression voltage value corresponding to a major component of a gas mixture and has a function of calling the stored value and changing the suppression voltage to the called value. To change the ionic species, the suppression voltage application unit 12-2 calls the suppression voltage value corresponding to the ionic species and applies the suppression voltage thereof to the suppression electrode 120. The electrical field intensity at the tip end of the emitter tip 1 can be thus changed according to the ionic species.

In the above description, the change of the electrical field intensity for changing the ionic species is carried out only by changing the suppression voltage. However, changing both the suppression voltage and extraction voltage to generate an equivalent change in voltage as a whole can also exert a similar effect.

<Embodiment 7>

The electrical field intensity at the tip end of the emitter tip 1 can be changed using the suppression electrode 120 in the ion beam device 200 described in FIG. 8 of Embodiment 4 as described in Embodiment 6.

In such a case, instead of the output of the ionic species switching signal from the extraction voltage application unit 4-2, the suppression voltage application unit 121-2 outputs a suppression voltage change signal. Upon receiving the suppression voltage change signal, the lens system controller 105-2, deflection system controller 106-2, and display 110-2 execute an operation according to the replacing ionic species. Embodiment 7 can therefore exert an effect equivalent to Embodiments 4 and 5.

Explanation of Reference Numerals

1: emitter tip, 1-1: microprotrusion, 2: extraction electrode, 3, 3-1: gas injection port part of gas supply pipe, 4, 4-2: extraction voltage application unit, 5, 5-1, 5-2: ion beam, 6: sample, 7: secondary electron, 8: extraction limiting diaphragm, 10: vacuum vessel, 11: exhaust port, 12: valve, 20: cooling head, 21-1, 21-2: heat transfer braided cable (oxygen-free copper), 22-1, 22-2: heat transfer supporter (oxygen-free copper), 23-1, 23-3: heat transfer insulator (sapphire), 24-1, 24-3: heat insulation supporter (stainless steel thin-wall pipe), 25: heater, 30: gas supply pipe, 31, 31-2: gas cylinder, 32: valve, 40-1, 40-2: high voltage introduction terminal, 41-1, 41-2: high voltage power supply, 42: emitter tip heating power supply, 43: acceleration voltage controller, 44, 44-2: extraction voltage controller, 45: extraction voltage memory, 100, 100-2: gas field ionization ion source, 101: sample stage, 102: lens system, 102-1, 102-2: electrostatic lens, 102-3: beam limiting diaphragm, 102-4: aligner, 103: deflection system, 103-1, 103-2: deflector, 104: secondary electron detector, 105, 105-2: lens system controller, 106, 106-2: deflection system controller, 110, 110-2: display, 120: suppression electrode, 121, 121-2: suppression voltage application unit

What is claimed:

1. An ion beam device, comprising:
   a sample stage holding a sample;
   a gas field ionization ion source emitting an ion beam generated by a gas mixture mainly containing gases of plural elements;
   a lens system converging the ion beam and projecting the ion beam onto the sample;
   a deflection system deflecting the ion beam to change an irradiation position of the ion beam on the sample;
   a secondary electron detector detecting secondary electrons emitted from the sample;
   an image processing unit forming an observation image of the sample using a result of detection by the secondary electron detector; and
   a controller controlling the lens system and the deflection system to adjust the irradiation position of the ion beam,
   wherein the image processing unit forms a first observation image corresponding to a first species of ion beams emitted from the gas field ionization ion source and a second observation image corresponding to a second species of ion beams emitted from the gas field ionization ion source, the second species being different from the first species, and
   wherein the image processing unit compares the first observation image with the second observation image to form a new image.

2. The ion beam device according to claim 1,
   the gas field ionization ion source further comprising:
   an electrode unit including an emitter electrode and an extraction electrode;
   a gas supply unit supplying the gas mixture to near a tip end of the emitter electrode;
   a voltage application unit applying a voltage between the emitter electrode and the extraction electrode to form an electrical field for ionizing the gas; and
   an extraction limiting diaphragm having an aperture allowing passage of an ion beam emitted from the emitter electrode.

3. The ion beam device according to claim 2, further comprising:
   a first storage storing data indicating a correspondence between a type of ions emitted from the emitter electrode and a voltage value applied by the voltage application unit during the emission.

4. The ion beam device according to claim 3, further comprising a second storage storing data indicating a correspondence between a type of ions emitted from the emitter electrode and setting values of the lens system and the deflection system, wherein
   the controller reads data corresponding to the data stored in the first storage from the second storage, and controls the lens system and the deflection system based on the setting values indicated by the read data.

5. The ion beam device according to claim 2, further comprising:
   a temperature controller individually controlling a temperature of the tip end of the emitter electrode and a temperature of a gas injection port part of the gas supply unit,
   wherein the temperature controller keeps the temperature of the gas injection port part of the gas supply unit higher than that of the tip end of the emitter electrode during ion emission, and variably controls the temperature of the gas injection port part depending on a boiling temperature of the gas.

6. The ion beam device according to claim 1,
   wherein the image processing unit compares the first observation image with the second observation image to form an image specific to surface roughness or an image specific to surface element species.

* * * * *